(12) United States Patent
Tan

(10) Patent No.: US 11,251,751 B1
(45) Date of Patent: Feb. 15, 2022

(54) SIGNAL MIXING CIRCUIT DEVICE AND RECEIVER

(71) Applicant: Hangzhou Geo-chip Technology Co., Ltd., Hangzhou (CN)

(72) Inventor: Chun Geik Tan, San Diego, CA (US)

(73) Assignee: HANGZHOU GEO-CHIP TECHNOLOGY CO., LTD.

( * ) Notice: Subject to any disclaimer, the term of this patent is extended or adjusted under 35 U.S.C. 154(b) by 0 days.

(21) Appl. No.: 17/126,735

(22) Filed: Dec. 18, 2020

(51) Int. Cl.
*H03D 7/14* (2006.01)
*H04B 1/16* (2006.01)

(52) U.S. Cl.
CPC ............. *H03D 7/1466* (2013.01); *H04B 1/16* (2013.01)

(58) Field of Classification Search
CPC ....................................................... H04B 1/16
USPC ........................................................ 455/293
See application file for complete search history.

(56) References Cited

U.S. PATENT DOCUMENTS

| 2007/0141998 A1* | 6/2007 | Zolfaghari | H04B 1/40 455/78 |
| 2009/0147884 A1* | 6/2009 | Sridharan | H04B 1/0007 375/316 |
| 2014/0355526 A1* | 12/2014 | Kahrizi | H04J 1/10 370/329 |
| 2015/0288394 A1* | 10/2015 | Kan | H04B 1/10 455/302 |

\* cited by examiner

*Primary Examiner* — Lee Nguyen
(74) *Attorney, Agent, or Firm* — McDonnell Boehnen Hulbert & Berghoff LLP

(57) ABSTRACT

A signal mixing circuit device and a receiver are disclosed, the signal mixing circuit device comprising first to fourth mixers, first and second signal amplifying circuits, a signal strength detector, a controller and an attenuator. A signal strength value for the output from the first signal amplifying circuit is detected using the signal strength detector. If the signal strength value is less than a first threshold, a high-gain path is initiated, so that noises respectively input to the first and second mixers together with local oscillator signals are eliminated by the fourth and third mixers respectively, thereby ensuring a high signal-to-noise ratio. If the signal strength value is greater than a second threshold, a low-gain path is initiated, which partially reuses the circuit of the high-gain path, thereby effectively reducing the overall circuit area and decreasing chip cost and power consumption.

18 Claims, 6 Drawing Sheets

SIGNAL MIXING CIRCUIT DEVICE AND RECEIVER

TECHNICAL FIELD

The present disclosure relates to the field of communication technologies, and in particular, to a signal mixing circuit device and a receiver.

BACKGROUND

A traditional receiver receives a Radio Frequency (RF) signal via its antenna, and thereafter the RF signal may sequentially pass through a band-pass filter or low-pass filter, a Matching Network (MN), a Low-Noise Amplifier (LNA), a mixer, an analog baseband filter, an Analog-to-Digital Converter (ADC) and a digital demodulator on a Printed Circuit Board (PCB), whereby the required signal is obtained, where the RF signal refers to electromagnetic waves in a certain frequency range that are radiated into space. The traditional receiver may amplify the RF signal to obtain a gain that meets a requirement. However, for RF signals of different strengths, respective signal amplifying circuits need to be designed, resulting in increased chip area and high power consumption for the signal amplifying circuits.

SUMMARY

The present disclosure provides a signal mixing circuit device and a receiver, in order to at least provide a beneficial alternative for overcoming or alleviating one or more problems of the prior art.

In a first aspect, a signal mixing circuit device is provided, including: a first mixer, a second mixer, a third mixer, a fourth mixer, a first signal amplifying circuit, a second signal amplifying circuit, a signal strength detector, a first controller, a second controller and an attenuator, where the signal mixing circuit device is configured such that:

the first mixer, the second mixer and the attenuator each receive an RF signal; the third mixer and the fourth mixer each receive an output from the attenuator;

the first signal amplifying circuit receives combined outputs from the first mixer and the fourth mixer, and the second signal amplifying circuit receives combined outputs from the second mixer and the third mixer; the signal strength detector receives an output from the first signal amplifying circuit, and the first controller and the second controller each receive an output from the signal strength detector; the first controller controls the first mixer and the second mixer, and the second controller controls the third mixer, the fourth mixer and the attenuator;

the signal strength detector is configured to detect a signal strength value for the output received from the first signal amplifying circuit and send a detection result to both the first controller and the second controller; and if the detection result is that the signal strength value is less than a first threshold, the first controller controls the first mixer and the second mixer to be turned on, and the second controller controls the third mixer and the fourth mixer to be turned on and controls the attenuator to be turned off, so that the first mixer samples a first group of local oscillator signals, the fourth mixer phase-invertedly samples the first group of local oscillator signals, the second mixer samples a second group of local oscillator signals, and the third mixer phase-invertedly samples the second group of local oscillator signals.

In some embodiments, if the detection result is that the signal strength value is greater than a second threshold, the first controller controls the first mixer and the second mixer to be turned off, the second controller controls the third mixer and the fourth mixer to be turned on and controls the attenuator to be turned on, where the first threshold is less than or equal to the second threshold.

In some embodiments, the first controller has an output terminal, which is connected to a first local oscillator signal input terminal of the first mixer, a second local oscillator signal input terminal of the first mixer, a first local oscillator signal input terminal of the second mixer, and a second local oscillator signal input terminal of the second mixer via respective resistors; and the second controller has an output terminal, which is connected to a first local oscillator signal input terminal of the third mixer, a second local oscillator signal input terminal of the third mixer, the first local oscillator signal input terminal of the fourth mixer, and the second local oscillator signal input terminal of the fourth mixer via respective resistors.

In some embodiments, the first group of local oscillator signals include a first local oscillator signal and a second local oscillator signal, and the second group of local oscillator signals include a third local oscillator signal and a fourth local oscillator signal;

where the first local oscillator signal input terminal of the first mixer is configured to sample the first local oscillator signal, and the second local oscillator signal input terminal of the first mixer is configured to sample the second local oscillator signal;

the first local oscillator signal input terminal of the second mixer is configured to sample the third local oscillator signal, and the second local oscillator signal input terminal of the second mixer is configured to sample the fourth local oscillator signal;

the first local oscillator signal input terminal of the third mixer is configured to sample the fourth local oscillator signal, and the second local oscillator signal input terminal of the third mixer is configured to sample the third local oscillator signal; and the first local oscillator signal input terminal of the fourth mixer is configured to sample the second local oscillator signal, and the second local oscillator signal input terminal of the fourth mixer is configured to sample the first local oscillator signal.

In some embodiments, the first local oscillator signal, the second local oscillator signal, the third local oscillator signal, and the fourth local oscillator signal have phases of 0°, 180°, 90° and 270°, respectively, such that phase differences between the first local oscillator signal and the second local oscillator signal and between the third local oscillator signal and the fourth local oscillator signal are each 180°.

In some embodiments, each of the first mixer, the second mixer, the third mixer and the fourth mixer has a first mixed-signal output terminal and a second mixed-signal output terminal, where the first mixed-signal output terminal of the first mixer and the second mixed-signal output terminal of the fourth mixer are connected to each other, and the second mixed-signal output terminal of the first mixer and the first mixed-signal output terminal of the fourth mixer are connected to each other; and the first mixed-signal output terminal of the second mixer and the second mixed-signal output terminal of the third mixer are connected to each other, and the second mixed-signal output terminal of the second mixer and the first mixed-signal output terminal of the third mixer are connected to each other.

In some embodiments, the first mixer includes a first transistor switch and a second transistor switch;

where the first transistor switch includes a gate, a drain and a source, the drain functioning as the first mixed-signal output terminal of the first mixer, and the gate being configured to sample a first local oscillator signal to function as the first local oscillator signal input terminal of the first mixer;

the second transistor switch includes a gate, a drain and a source, the drain functioning as the second mixed-signal output terminal of the first mixer, and the gate being configured to sample the second local oscillator signal to function as the second local oscillator signal input terminal of the first mixer; and the source of the first transistor switch and the source of the second transistor switch are connected to each other to function as an input terminal of the first mixer for receiving the RF signal.

In some embodiments, the second mixer includes a first transistor switch and a second transistor switch;

where the first transistor switch includes a gate, a drain and a source, the drain functioning as the first mixed-signal output terminal of the second mixer, and the gate being configured to sample the third local oscillator signal to function as the first local oscillator signal input terminal of the second mixer;

the second transistor switch includes a gate, a drain and a source, the drain functioning as the second mixed-signal output terminal of the second mixer, and the gate being configured to sample the fourth local oscillator signal to function as the second local oscillator signal input terminal of the second mixer; and the source of the first transistor switch and the source of the second transistor switch are connected to each other to function as an input terminal of the second mixer for receiving the RF signal.

In some embodiments, the third mixer includes a first transistor switch and a second transistor switch;

where the first transistor switch includes a gate, a drain and a source, the drain functioning as the first mixed-signal output terminal of the third mixer, and the gate being configured to sample the fourth local oscillator signal to function as the first local oscillator signal input terminal of the third mixer;

the second transistor switch includes a gate, a drain and a source, the drain functioning as the second mixed-signal output terminal of the third mixer, and the gate being configured to sample the third local oscillator signal function as the second local oscillator signal input terminal of the third mixer; and the source of the first transistor switch and the source of the second transistor switch are connected to each other to function as an input terminal of the third mixer for receiving the output from the attenuator.

In some embodiments, the fourth mixer includes a first transistor switch and a second transistor switch;

where the first transistor switch includes a gate, a drain and a source, the drain functioning as the first mixed-signal output terminal of the fourth mixer, and the gate being configured to sample the second local oscillator signal to function as the first local oscillator signal input terminal of the fourth mixer;

the second transistor switch includes a gate, a drain and a source, the drain functioning as the second mixed-signal output terminal of the fourth mixer, and the gate being configured to sample the first local oscillator signal to function as the second local oscillator signal input terminal of the fourth mixer; and the source of the first transistor switch and the source of the second transistor switch are connected to each other to function as an input terminal of the fourth mixer for receiving the output from the attenuator.

In some embodiments, the first signal amplifying circuit includes a first stage of amplifier and first resistors;

where the first stage of amplifier includes a first input terminal, a second input terminal, a first output terminal and a second output terminal; the first resistors are respectively connected in parallel between the first input terminal and the first output terminal, and between the second input terminal and the second output terminal; and the first input terminal of the first stage of amplifier is connected to the first mixed-signal output terminal of the first mixer, and the second input terminal of the first stage of amplifier is connected to the second mixed-signal output terminal of the first mixer.

In an embodiment, the second signal amplifying circuit includes a first stage of amplifier and first resistors;

where the first stage of amplifier includes a first input terminal, a second input terminal, a first output terminal and a second output terminal; the first resistors are respectively connected in parallel between the first input terminal and the first output terminal, and between the second input terminal and the second output terminal; and the first input terminal of the first stage of amplifier is connected to the first mixed-signal output terminal of the third mixer, and the second input terminal of the first stage of amplifier is connected to the second mixed-signal output terminal of the third mixer.

In some embodiments, the first signal amplifying circuit includes a first stage of amplifier, a second stage of amplifier, first resistors and second resistors;

where the first stage of amplifier includes a first input terminal, a second input terminal, a first output terminal and a second output terminal, with the first input terminal of the first stage of amplifier connected to the first mixed-signal output terminal of the first mixer, and the second input terminal of the first stage of amplifier connected to the second mixed-signal output terminal of the first mixer;

the second stage of amplifier includes a first input terminal, a second input terminal, a first output terminal and a second output terminal, with the first input terminal of the second stage of amplifier and the first output terminal of the first stage of amplifier connected at a first joint, and the second input terminal of the second stage of amplifier and the second output terminal of the first stage of amplifier connected at a second joint; and the first resistors are respectively connected in parallel between the first input terminal of the first stage of amplifier and the first output terminal of the second stage of amplifier, and between the second input terminal of the first stage of amplifier and the second output terminal of the second stage of amplifier; the second resistors are respectively connected in parallel between the first joint and the first output terminal of the second stage of amplifier, and between the second joint and the second output terminal of the second stage of amplifier.

In some embodiments, the second signal amplifying circuit includes a first stage of amplifier, a second stage of amplifier, first resistors and second resistors;

where the first stage of amplifier includes a first input terminal, a second input terminal, a first output terminal and a second output terminal; the first input terminal of the first stage of amplifier is connected to the first mixed-signal output terminal of the third mixer, and the second input terminal of the first stage of amplifier is connected to the second mixed-signal output terminal of the third mixer;

the second stage of amplifier includes a first input terminal, a second input terminal, a first output terminal and a second output terminal; the first input terminal of the second stage of amplifier and the first output terminal of the first stage of amplifier are connected at a first joint, and the second input terminal of the second stage of amplifier and the second output terminal of the first stage of amplifier are connected at a second joint; and the first resistors are respectively connected in parallel between the first input terminal of the first stage of amplifier and the first output terminal of the second stage of amplifier, and between the second input terminal of the first stage of amplifier and the second output terminal of the second stage of amplifier; the second resistors are respectively connected in parallel between the first joint and the first output terminal of the second stage of amplifier, and between the second joint and the second output terminal of the second stage of amplifier.

In some embodiments, the attenuator includes a plurality of first resistors having the same resistance of R and a plurality of second resistors having the same resistance of 2R;

where the plurality of first resistors are connected in series, with one end of each second resistor connected between two adjacent first resistors, and the other end of each second resistor grounded.

In some embodiments, the attenuator includes a plurality of first resistors having the same resistance of R, a plurality of second resistors having the same resistance of 2R, and a third resistor having a resistance of R/N, N being greater than or equal to 1;

where the plurality of first resistors are connected in series and form a main circuit, with the third resistor connected in parallel between two ends of the main circuit, one end of each second resistor connected between two adjacent first resistors, and the other end of each second resistor grounded.

In a second aspect, a receiver is provided, including at least one signal mixing circuit device described above.

The above technical solutions bring in the following advantages: the signal strength value of a signal output by the first signal amplifying circuit is detected by a signal strength detector, and if the detection result is that the signal strength value is less than a first threshold, a high-gain path is initiated, so that noise at the local oscillator signal input terminals of the first mixer is eliminated by a fourth mixer, and noise at the local oscillator signal input terminals of the second mixer is eliminated by a third mixer, thereby ensuring a high signal-to-noise ratio; if the detection result is that the signal strength value is greater than a second threshold, a low-gain path is initiated, which partially reuses the circuit of the high-gain path, thus the overall circuit area is reduced effectively, whereby chip cost and power consumption is decreased.

The above description is provided for the purpose of better understanding of the present disclosure, but is not intended to limit the present disclosure in any way. In addition to the illustrative aspects, embodiments and features as described herein with reference to the drawings, additional aspects, embodiments and features would become apparent to those skilled in the art.

BRIEF DESCRIPTION OF THE DRAWINGS

Unless otherwise specified, the similar reference numerals represent the same or similar parts or elements throughout the drawings. These drawings are not necessarily made in proportion. It should be appreciated that these drawings merely illustrate some embodiments of the present disclosure and are not intended to limit the scope of the present disclosure.

Figure 1:
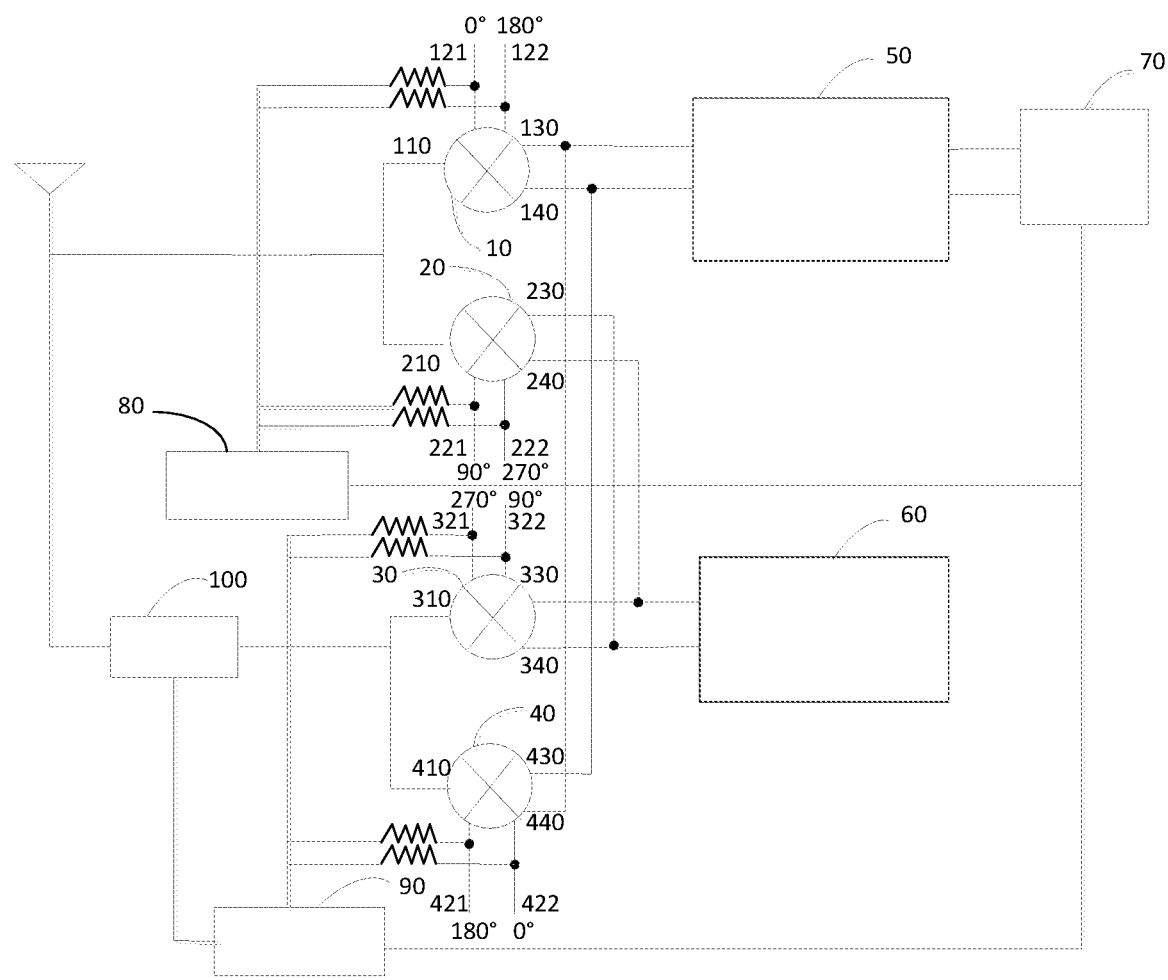
FIG. 1 is a schematic structural diagram of a signal mixing circuit device according to an embodiment of the disclosure.

| List of reference numerals | |
|---|---|
| 10 First Mixer | |
| 110 Input Terminal | 130 First Mixed-signal Output Terminal |
| 140 Second Mixed-signal Output Terminal | 121 FirstLocal Oscillator Signal Input Terminal |
| 122 Second Local Oscillator Signal Input Terminal | |
| 20 Second Mixer | |
| 210 Input Terminal | 230 First Mixed-signal Output Terminal |
| 240 Second Mixed-signal Output Terminal | 221 First Local Oscillator Signal Input Terminal |
| 222 Second Local Oscillator Signal Input Terminal | |
| 30 Third Mixer | |
| 310 Input Terminal | 330 First Mixed-signal Output Terminal |
| 340 Second Mixed-signal Output Terminal | 321 First Local Oscillator Signal Input Terminal |
| 322 Second Local Oscillator Signal Input Terminal | |
| 40 Fourth Mixer | |
| 410 Input Terminal | 430 First Mixed-signal Output Terminal |
| 440 Second Mixed-signal Output Terminal | 421 First Local Oscillator Signal Input Terminal |
| 422 Second Local Oscillator Signal Input Terminal | |
| 50 First Signal Amplifying Circuit | |
| 510 First Stage of Amplifier | |

-continued

List of reference numerals

| | | | |
|---|---|---|---|
| 511 | First Input Terminal | 512 | Second Input Terminal |
| 513 | First Output Terminal | 514 | Second Output Terminal |
| 520 | Second Stage of Amplifier | | |
| 521 | First Input Terminal | 522 | Second Input Terminal |
| 523 | First Output Terminal | 524 | Second Output Terminal |
| A | First Joint | B | Second Joint |
| 60 | Second Signal Amplifying Circuit | | |
| 610 | First Stage of Amplifier | | |
| 611 | First Input Terminal | 612 | Second Input Terminal |
| 613 | First Output Terminal | 614 | Second Output Terminal |
| 620 | Second Stage of Amplifier | | |
| 621 | First Input Terminal | 622 | Second Input Terminal |
| 623 | First Output Terminal | 624 | Second Output Terminal |
| A' | First Joint | B' | Second Joint |
| 111 | First Transistor Switch Of First Mixer | 112 | Second Transistor Switch Of First Mixer |
| 113 | First Transistor Switch of Fourth Mixer | 114 | Second Transistor Switch of Fourth Mixer |
| 70 | Signal Strength Detector | 80 | First Controller |
| 90 | Second Controller | 100 | Attenuator |
| 1001 | Attenuate Unit | C | Third Joint |
| D | Fourth Joint | | |

DETAILED DESCRIPTION

In the following description, only some exemplary embodiments are described. As will be appreciated by those skilled in the art, the described embodiments may be modified in various ways without departing from the spirit or scope of the present disclosure. Therefore, the drawings and descriptions are to be regarded as illustrative rather than restrictive in nature.

In the description of the present disclosure, it should be understood that terms such as center, longitudinal, transverse, length, width, thickness, upper, lower, front, rear, left, right, vertical, horizontal, top, bottom, inner, outer, clockwise, counterclockwise, axial, radial, and circumferential indicate an orientation or positional relationship that is based on the orientation or positional relationship shown in the drawings for the sake of the convenient and simplified description of the present disclosure, but do not indicate or imply that the involved device or element necessarily has or operates in the specified orientation, and thus should not be understood as a limitation of the present disclosure.

In addition, the terms "first" and "second" are used for differentiating technical features, but are not intended to indicate or imply the importance of these technical features or implicitly show the number of these technical features. Thus, technical features defined by the terms "first" and "second" may explicitly or implicitly include one or more of the technical features. In the description of the present disclosure, the expression of "a plurality of" means two or more, unless otherwise specifically defined.

In the present disclosure, unless otherwise specified and defined explicitly, the terms "arranged", "coupled", "connected", "fixed" and the like should be understood in a broad sense, and may refer to, for example, a fixed or detachable connection or being integrated as a whole; a mechanical, electrical or communication connection; a direct connection or an indirect connection through an intermediate medium, or an internal communication between two elements or an interaction between two elements. The specific meanings of the above terms in the present disclosure may be understood by those skilled in the art depending on the specific context.

In the present disclosure, unless otherwise specified and defined explicitly, a first feature being "above" or "below" a second feature includes that the first feature is in direct contact with the second feature, or that the first and second features are in contact with each other indirectly via an additional feature therebetween. Moreover, the first feature being "above", "over" or "on" the second feature may include that the first feature is right above or inclinedly above the second feature, or simply that the first feature is higher in level than the second feature. Likewise, the first feature being "below" or "under" the second feature may include that the first feature is right below or inclinedly below the second feature, or simply that the first feature is lower in level than the second feature.

The following disclosure provides various embodiments or examples for illustrating the implementation of various structures of the present disclosure. In order to simplify the disclosure of the present disclosure, components and arrangements of specific examples are described below. Of course, these examples are merely illustrative, but not intended to limit the present disclosure. In addition, the same reference numerals may be used throughout different examples for the sake of simplification and clarity, but do not necessarily mean any relationship between the various embodiments or examples. Additionally, examples of various specific processes and material are provided in the present disclosure, but the application of other processes and/or other materials may readily occur to one of ordinary skills in the art.

As shown in FIG. 1, in one specific embodiment, there provides a signal mixing circuit device, including: a first mixer 10, a second mixer 20, a third mixer 30, a fourth mixer 40, a first signal amplifying circuit 50, a second signal amplifying circuit 60, a signal strength detector 70, a first controller 80, a second controller 90 and an attenuator 100.

The input terminals 110, 210 of the first mixer 10 and the second mixer 20 are connected to each other and configured to receive an RF signal; the input terminals 310, 410 of the third mixer 30 and the fourth mixer 40 are both connected to the output terminal of the attenuator 100, and the input terminal of the attenuator 100 is configured to receive the RF signal.

Both the output terminals 130, 140 of the first mixer 10 and the output terminals 430, 440 of the fourth mixer 40 are connected to the input terminals of the first signal amplifying circuit 50, both the output terminals 230, 240 of the second mixer 20 and the output terminals 330, 340 of the third mixer 30 are connected to the input terminals of the second signal amplifying circuit 60; the output terminals of the first signal amplifying circuit 50 are connected to the input terminals of the signal strength detector 70, and the output terminal of the signal strength detector 70 is connected to both the first controller 80 and the second controller 90; the output terminal of the first controller 80 is connected to the first mixer 10 and the second mixer 20, and the output terminals of the second controller 90 are connected to the third mixer 30, the fourth mixer 40 and the attenuator 100.

The signal strength detector 70 is configured to detect the signal strength value for the output from the first signal amplifying circuit 50 and send the detection result to the first controller 80 and the second controller 90.

If the detection result is that the signal strength value is less than a first threshold, the first controller 80 controls the first mixer 10 and the second mixer 20 to be turned on, and the second controller 90 controls the third mixer 30 and the fourth mixer 40 to be turned on and controls the attenuator 100 to be turned off, so that the first mixer 10 samples a first group of local oscillator signals, the fourth mixer 40 phase-invertedly samples the first group of local oscillator signals, the second mixer 20 samples a second group of local oscillator signals, and the third mixer 30 phase-invertedly samples the second group of local oscillator signals.

In one example, the original RF signal from an antenna enters the first mixer 10 and then passes through the first signal amplifying circuit 50, and the amplified RF signal is detected by the signal strength detector 70. The signal strength detector 70 may detect a Received Signal Strength Indicator (RSSI) for the amplified signal. If the signal strength detection result obtained with the RSSI is that the signal strength value of the amplified RF signal is less than a first threshold, it means that the strength of the original RF signal is relatively low, where the value of the first threshold may be set according to different requirements. The signal strength detector 70 sends the detection result to the first controller 80 and the second controller 90. The first controller 80 controls the first mixer 10 and the second mixer 20 to be turned on according to the detection result, so that the RF signal and the corresponding local oscillator signal are input into the first mixer 10 and the second mixer 20. The second controller 90 controls the third mixer 30 and the fourth mixer 40 to be turned on and controls the attenuator 100 to be turned off according to the detection result, so that the RF signal cannot be input to the third mixer 30 and the fourth mixer 40. As such, a high-gain path is activated in the signal mixing circuit device. In the high-gain path, the first mixer 10 samples a first group of local oscillator signals, the fourth mixer 40 phase-invertedly samples the first group of local oscillator signals, the second mixer 20 samples a second group of local oscillator signals, and the third mixer 30 phase-invertedly samples the second group of local oscillator signals. Phase-inverted sampling refers to that a local oscillator signal, which is input and sampled at a local oscillator signal input terminal of a mixer, has an inverted phase compared with the case where the local oscillator signal is input and sampled at the corresponding local oscillator signal input terminal of another mixer. For example, if a local oscillator signal having a phase of 0° is input to the first local oscillator signal input terminal 121 of the first mixer 10 and a local oscillator signal having a phase of 180° is input to the second local oscillator signal input terminal 122 of the first mixer 10, the phase-invertedly sampling at the fourth mixer 40 refers to that the local oscillator signal having the phase of 180° is input to the first local oscillator signal input terminal 421 of the fourth mixer 40, and the local oscillator signal having the phase of 0° is input to the second local oscillator signal input terminal 422 of the fourth mixer 40. In this way, noise at the local oscillator signal input terminals of the first mixer 10 is eliminated via a double balanced feature that is a core feature of the fourth mixer 40. Similarly, noise at the local oscillator signal input terminals of the second mixer 20 is eliminated via a doubled balance feature that is a core feature of the third mixer 30. Therefore, it can be ensured that the receiver has a high signal-to-noise ratio by lowering the noise figure.

As the RF signal is input to the first mixer 10, the first mixer 10 multiplies the RF signal received from the antenna by the local oscillator signal and outputs an intermediate frequency signal. Since the output terminals of the first signal amplifying circuit 50 are further connected to other devices of the internal circuit, the intermediate frequency signal is input to the first signal amplifying circuit 50 and then input to other devices of the internal circuit after being amplified. As the RF signal is input to the second mixer 20, the second mixer 20 multiplies the RF signal received from the antenna by the local oscillator signal and outputs another intermediate frequency signal. Since the output terminals of the second signal amplifying circuit 60 are further connected to other devices of the internal circuit, another intermediate frequency signal is input to the second signal amplifying circuit 60 and then input to other devices of the internal circuit after being amplified.

According to this embodiment, there provides a signal mixing circuit device enabled to eliminate noise at the local oscillator signal input terminals of the mixer and thus ensure a high signal-to-noise ratio by initiating a high gain path in the case that the signal strength value is less than a first threshold.

In some embodiments, if the detection result is that the signal strength value is greater than a second threshold, the first controller controls the first mixer and the second mixer to be turned off, and the second controller controls the third mixer and the fourth mixer to be turned on and controls the attenuator to be turned on, where the first threshold is less than or equal to the second threshold.

In one example, in the case that the signal strength detection result obtained with the RSSI is that the signal strength value is greater than a second threshold, it means that the strength of the original RF signal is high, and the signal strength detector 70 sends the detection result to the first controller 80 and the second controller 90. The first controller 80 controls the local oscillator signal to be not input to the first mixer 10 and the second mixer 20 according to the detection result, so that the first mixer 10 and the second mixer 20 are turned-off. The second controller 90 controls the third mixer 30 and the fourth mixer 40 as well as the attenuator 100 to be turned on according to the detection result, so that the attenuated RF signal output by the attenuator and the corresponding local oscillator signal are enabled to be input to the third mixer 30 and the fourth mixer 40. As such, a low-gain path is activated in the signal mixing circuit device.

In the low-gain path, the original RF signal is transmitted to the attenuator 100 from an antenna, and the signal strength of an RF signal with a high signal strength is decreased by the attenuator 100. Since the strength of the original RF signal is relatively high, the influence of the noise figure is relatively small, thus the noise at the local oscillator signal receiving terminals of the mixer is not necessary to be eliminated. The attenuated RF signal is input to the third mixer 30 and the fourth mixer 40 to obtain a mixed signal, and then the mixed signal is amplified by the first signal amplifying circuit 50 and the second signal amplifying circuit 60.

According to this embodiment, in the case that the signal strength value is greater than a second threshold, a low-gain path is initiated, whereby the overall circuit area can be reduced effectively and thus chip cost and power consumption can be decreased, because the circuit of the high-gain path is partially reused by the low-gain path.

In some embodiments, as shown in FIG. 1, the output terminal of the first controller 80 is connected to the first local oscillator signal input terminal 121 of the first mixer 10, the second local oscillator signal input terminal 122 of the first mixer 10, the first local oscillator signal input terminal 221 of the second mixer 20, and the second local oscillator signal input terminal 222 of the second mixer 20 via respective resistors; and the output terminal of the second controller 90 is connected to the first local oscillator signal input terminal 321 of the third mixer 30, the second local oscillator signal input terminal 322 of the third mixer 30, the first local oscillator signal input terminal 421 of the fourth mixer 40, and the second local oscillator signal input terminal 422 of the fourth mixer 40 via respective resistors.

In one example, in the case that the signal strength value is less than a first threshold, the first controller 80 outputs a logic signal 1 to the first local oscillator signal input terminal 121 and the second local oscillator signal input terminal 122 of the first mixer 10, and the first local oscillator signal input terminal 221 and the second local oscillator signal input terminal 222 of the second mixer 20, and the second controller 90 outputs a logic signal 1 to the first local oscillator signal input terminal 321 and the second local oscillator signal input terminal 322 of the third mixer 30, and the first local oscillator signal input terminal 421 and the second local oscillator signal input terminal 422 of the fourth mixer 40, so that the corresponding local oscillator signals can be input to the above local oscillator signal input terminals, that is, the first mixer 10, the second mixer 20, the third mixer 30 and the fourth mixer 40 are turned on. The second controller 90 further controls the attenuator to be turned off. As such, a high-gain path is activated in the signal mixing circuit device.

In the case that the signal strength value is greater than a second threshold, the controller 80 outputs a logic signal 0 to the first local oscillator signal input terminal 121 and the second local oscillator signal input terminal 122 of the first mixer 10, and the first local oscillator signal input terminal 221 and the second local oscillator signal input terminal 222 of the second mixer 20, that is, no local oscillator signal is input to the first mixer and the second mixer, and the first mixer and the second mixer are in turned-off states; and the second controller 90 outputs a logic signal 1 to the first local oscillator signal input terminal 321 and the second local oscillator signal input terminal 322 of the third mixer 30, and the first local oscillator signal input terminal 421 and the second local oscillator signal input terminal 422 of the fourth mixer 40, that is, the third mixer and the fourth mixer are turned on, and the attenuator is further controlled to be turned on, so that the attenuated RF signal output by the attenuator can be input to the third mixer and the fourth mixer. As such, a low-gain path is activated in the signal mixing circuit device.

In some embodiments, the first group of local oscillator signals include a first local oscillator signal and a second local oscillator signal, and the second group of local oscillator signals include a third local oscillator signal and a fourth local oscillator signal, where:

the first local oscillator signal input terminal 121 of the first mixer 10 is configured to sample the first local oscillator signal, and the second local oscillator signal input terminal 122 of the first mixer 10 is configured to sample the second local oscillator signal;

the first local oscillator signal input terminal 221 of the second mixer 20 is configured to sample the third local oscillator signal, and the second local oscillator signal input terminal 222 of the second mixer 20 is configured to sample the fourth local oscillator signal;

the first local oscillator signal input terminal 321 of the third mixer 30 is configured to sample the fourth local oscillator signal, and the second local oscillator signal input terminal 322 of the third mixer 30 is configured to sample the third local oscillator signal; and the first local oscillator signal input terminal 421 of the fourth mixer 40 is configured to sample the second local oscillator signal, and the second local oscillator signal input terminal 422 of the fourth mixer 40 is configured to sample the first local oscillator signal.

In one example, as shown in FIG. 1, a first local oscillator signal having a phase of 0° is input to the first local oscillator signal input terminal 121 of the first mixer 10, and a second local oscillator signal having a phase of 180° is input to the second local oscillator signal input terminal 122 of the first mixer 10. Moreover, to the first local oscillator signal input terminal 421 of the fourth mixer 40, the second local oscillator signal having the phase of 180° is input, and to the second local oscillator signal input terminal 422 of the fourth mixer 40, the first local oscillator signal having the phase of 0° is input. Accordingly, noise at the local oscillator signal input terminals of the first mixer 10 is eliminated via a double balanced feature that is the core feature of the fourth mixer 40.

Similarly, a third local oscillator signal having a phase of 90° is input to the first local oscillator signal input terminal 221 of the second mixer 20, and a fourth local oscillator signal having a phase of 270° is input to the second local oscillator signal input terminal 222 of the second mixer 20. Moreover, to the first local oscillator signal input terminal 321 of the third mixer 30, the fourth local oscillator signal having the phase of 270° is input, and to the second local oscillator signal input terminal 322 of the third mixer 30, the third local oscillator signal having the phase of 90° is input. Accordingly, noise at the local oscillator signal input terminals of the second mixer 20 is eliminated via a double balanced feature that is the core feature of the third mixer 30.

In some embodiments, the first local oscillator signal, the second local oscillator signal, the third local oscillator signal and the fourth local oscillator signal have phases of 0°, 180°, 90° and 270°, respectively, such that the phase differences between the first local oscillator signal and the second local oscillator signal, and between the third local oscillator signal and the fourth local oscillator signal are each 180°.

In one example, of course, the first local oscillator signal, the second local oscillator signal, the third local oscillator signal and the fourth local oscillator signal may also have phases of 90°, 270°, 0° and 180°, respectively, or adaptive adjustment may be performed according to the actual situation, which all falls into the protection scope of the disclosure.

In some embodiments, as shown in FIG. 1, the first mixed-signal output terminal 130 of the first mixer 10 and the second mixed-signal output terminal 440 of the fourth mixer 40 are connected to each other, and the second mixed-signal output terminal 140 of the first mixer 10 and the first mixed-signal output terminal 430 of the fourth mixer 40 are connected to each other; and the first mixed-signal output terminal 230 of the second mixer 20 and the second mixed-signal output terminal 340 of the third mixer 30 are connected to each other, and the second mixed-signal output terminal 240 of the second mixer 20 and the first mixed-signal output terminal 330 of the third mixer 30 are connected to each other.

Figure 2:
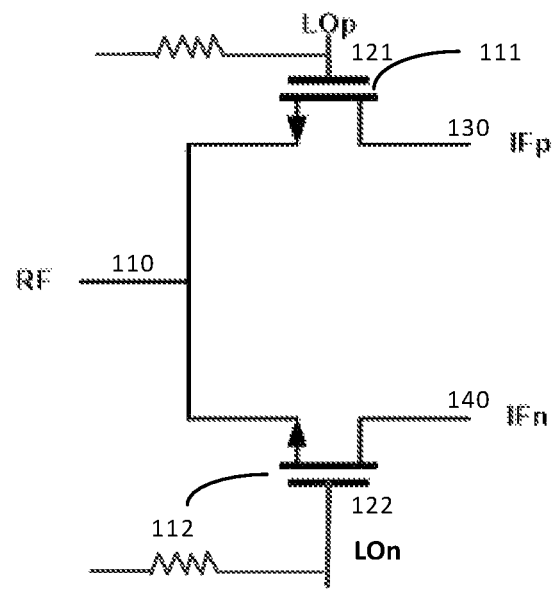
FIG. 2 is a schematic diagram showing the internal structure of a first mixer according to an embodiment of the disclosure.

In some embodiments, as shown in FIG. 2, the first mixer 10 includes a first transistor switch 111 and a second transistor switch 112.

The first transistor switch 111 includes a gate, a drain and a source, where the drain functions as the output terminal 130 of the first mixer, and the gate is configured to sample a first local oscillator signal to function as the first local oscillator signal input terminal 121 of the first mixer 10.

The second transistor switch 112 includes a gate, a drain and a source, where the drain functions as the second mixed-signal output terminal 140 of the first mixer 10, and the gate is configured to sample the second local oscillator signal to function as the second local oscillator signal input terminal 122 of the first mixer.

The sources of the first transistor switch 111 and the second transistor switch 112 are connected to each other to function as the input terminal 110 of the first mixer.

In one example, the first transistor switch 111 and the second transistor switch 112 may be a PMOS transistor or an NMOS transistor. The gate of the first transistor switch 111 functions as the first local oscillator signal input terminal 121, and the gate of the second transistor switch 112 functions as the second local oscillator signal input terminal 122.

The first transistor switch 111 and the second transistor switch 112 are configured to sample the RF signal and down-convert it to an intermediate frequency signal. Specifically, the RF signal may be down-converted into a differential intermediate frequency signal by employing a differential sampling clock. The purpose of the down conversion is to decrease the carrier frequency of the signal or simply remove the carrier frequency to obtain a baseband signal. The first mixed signal IFp and the second mixed signal IFn may be differential intermediate frequency signals.

In some embodiments, the second mixer 20 includes a first transistor switch and a second transistor switch.

The first transistor switch includes a gate, a drain and a source, where the drain functions as the first mixed-signal output terminal 230 of the second mixer 20, and the gate is configured to sample the third local oscillator signal to function as the first local oscillator signal input terminal 221 of the second mixer 20.

The second transistor switch includes a gate, a drain and a source, where the drain functions as the second mixed-signal output terminal 240 of the second mixer 20, and the gate is configured to sample the fourth local oscillator signal to function as the second local oscillator signal input terminal 222 of the second mixer 20.

The sources of the first transistor switch and the second transistor switch are connected to each other to function as the input terminal 210 of the second mixer.

In one example, the internal structure of the second mixer 20 is similar to that of the first mixer 10, which is not specifically shown.

In some embodiments, the third mixer 30 includes a first transistor switch and a second transistor switch.

The first transistor switch includes a gate, a drain and a source, where the drain functions as the first mixed-signal output terminal 330 of the third mixer 30, and the gate is configured to sample the fourth local oscillator signal to function as the first local oscillator signal input terminal 321 of the third mixer.

The second transistor switch includes a gate, a drain and a source, where the drain functions as the second mixed-signal output terminal 340 of the third mixer, and the gate is configured to function as the second local oscillator signal input terminal 322 of the third mixer.

The sources of the first transistor switch and the second transistor switch are connected to each other to function as the input terminal 310 of the third mixer.

In one example, the internal structure of the third mixer is similar to that of the fourth mixer, which is not specifically shown.

Figure 3:
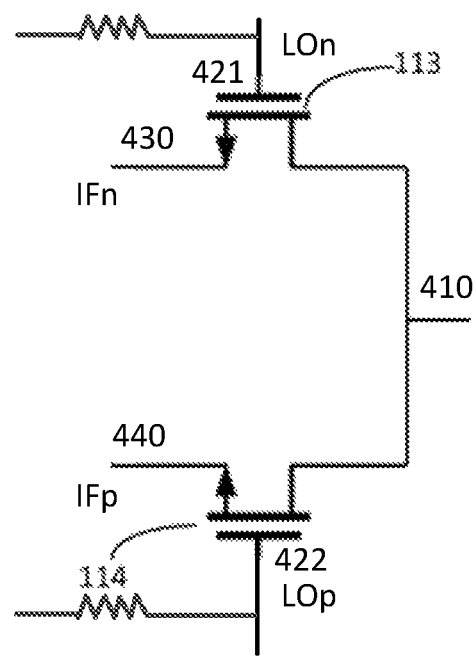
FIG. 3 is a schematic diagram showing the internal structure of a fourth mixer according to an embodiment of the disclosure.

In some embodiments, as shown in FIG. 3, the fourth mixer 40 includes a first transistor switch 113 and a second transistor switch 114.

The first transistor switch 113 includes a gate, a drain and a source, where the drain functions as the first mixed-signal output terminal 430 of the fourth mixer 40, and the gate is configured to sample the second local oscillator signal to function as the first local oscillator signal input terminal 421 of the fourth mixer 40.

The second transistor switch 114 includes a gate, a drain and a source, where the drain functions as the second mixed-signal output terminal 440 of the fourth mixer 40, and the gate is configured to sample the first local oscillator signal to function as the second local oscillator signal input terminal 422 of the fourth mixer 40.

The sources of the first transistor switch 113 and the second transistor switch 114 are connected to each other to function as the input terminal 410 of the fourth mixer.

In one example, the first transistor switch 113 and the second transistor switch 114 may be a PMOS transistor or an NMOS transistor. The gate in the first transistor switch 113 functions as the first local oscillator signal input terminal 421 of the fourth mixer 40 for receiving the second local oscillator signal. The gate of the second transistor switch 114 functions as the second local oscillator signal input terminal 422 of the fourth mixer 40 for receiving the first local oscillator signal. Cancellation of mixed signals occurs between the first mixer 10 and the fourth mixer 40, thus the terminal noise at the input terminals of the first group of local oscillator signals in the first mixer 10 may be effectively eliminated.

Figure 4:
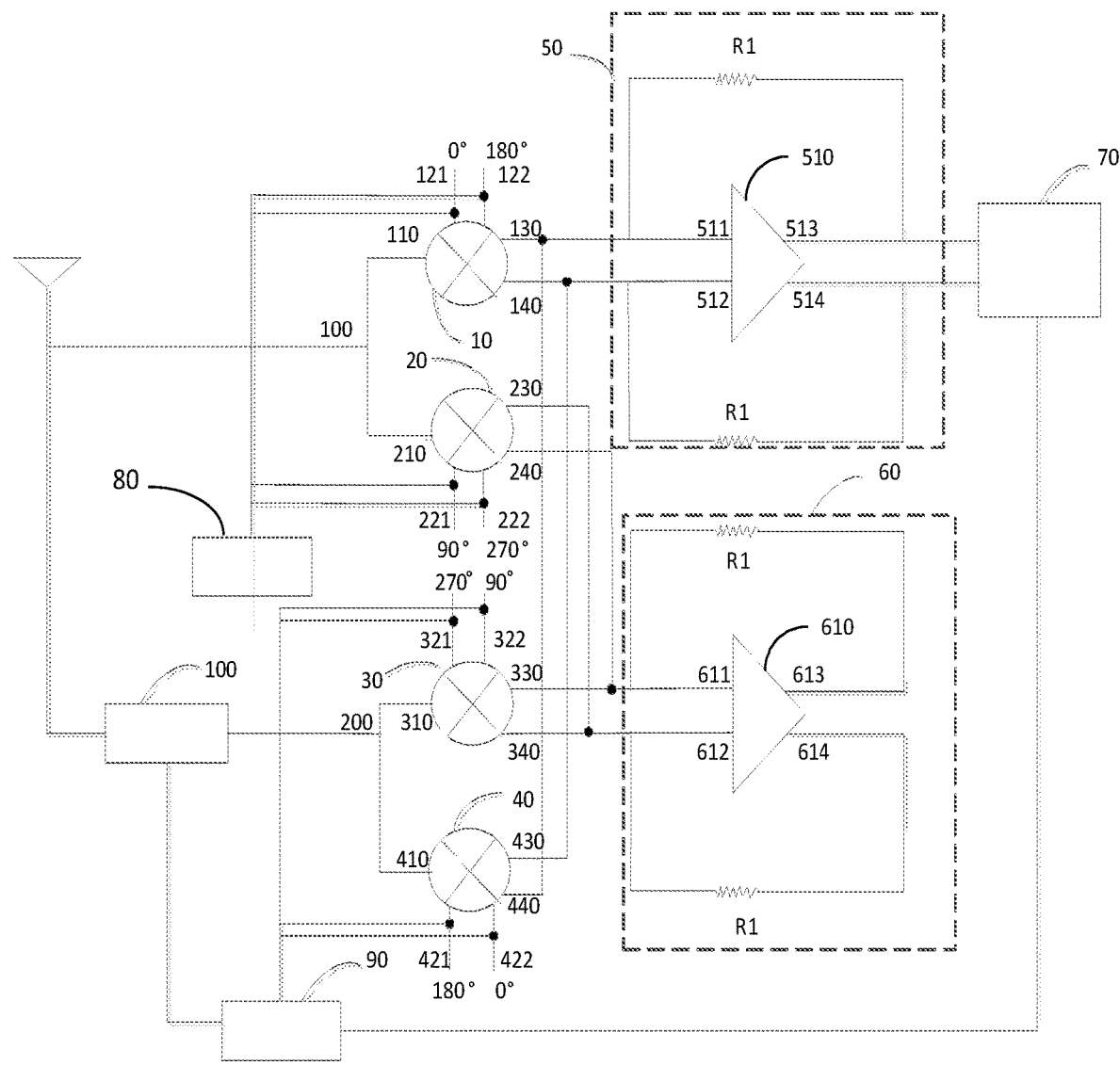
FIG. 4 is a schematic structural diagram of a signal mixing circuit device according to another embodiment of the disclosure.

In some embodiments, as shown in FIG. 4, the first signal amplifying circuit 50 includes a first stage of amplifier 510 and first resistors R1;

where the first stage of amplifier 510 includes a first input terminal 511, a second input terminal 512, a first output terminal 513 and a second output terminal 514; the first resistors R1 are respectively connected in parallel between the first input terminal 511 and the first output terminal 513, and between the second input terminal 512 and the second output terminal 514;

and the first input terminal of 511 of the first stage of amplifier 510 is connected to the first mixed-signal output terminal 130 of the first mixer 10, and the second input terminal 512 of the first stage of amplifier 510 is connected to the second mixed-signal output terminal 140 of the first mixer 10.

In some embodiments, as shown in FIG. 4, the second signal amplifying circuit 60 includes a first stage of amplifier 610 and first resistors R1;

where the first stage of amplifier 610 includes a first input terminal 611, a second input terminal 612, a first output terminal 613 and a second output terminal 614; the first resistors R1 are respectively connected in parallel between the first input terminal 611 and the first output terminal 613, and between the second input terminal 612 and the second output terminal 614; and the first input terminal 611 of the first stage of amplifier 610 is connected to the first mixed-signal output terminal 330 of the third mixer 30, and the second input terminal 612 of the first stage of amplifier 610 is connected to the second mixed-signal output terminal 340 of the third mixer 30.

Figure 5:
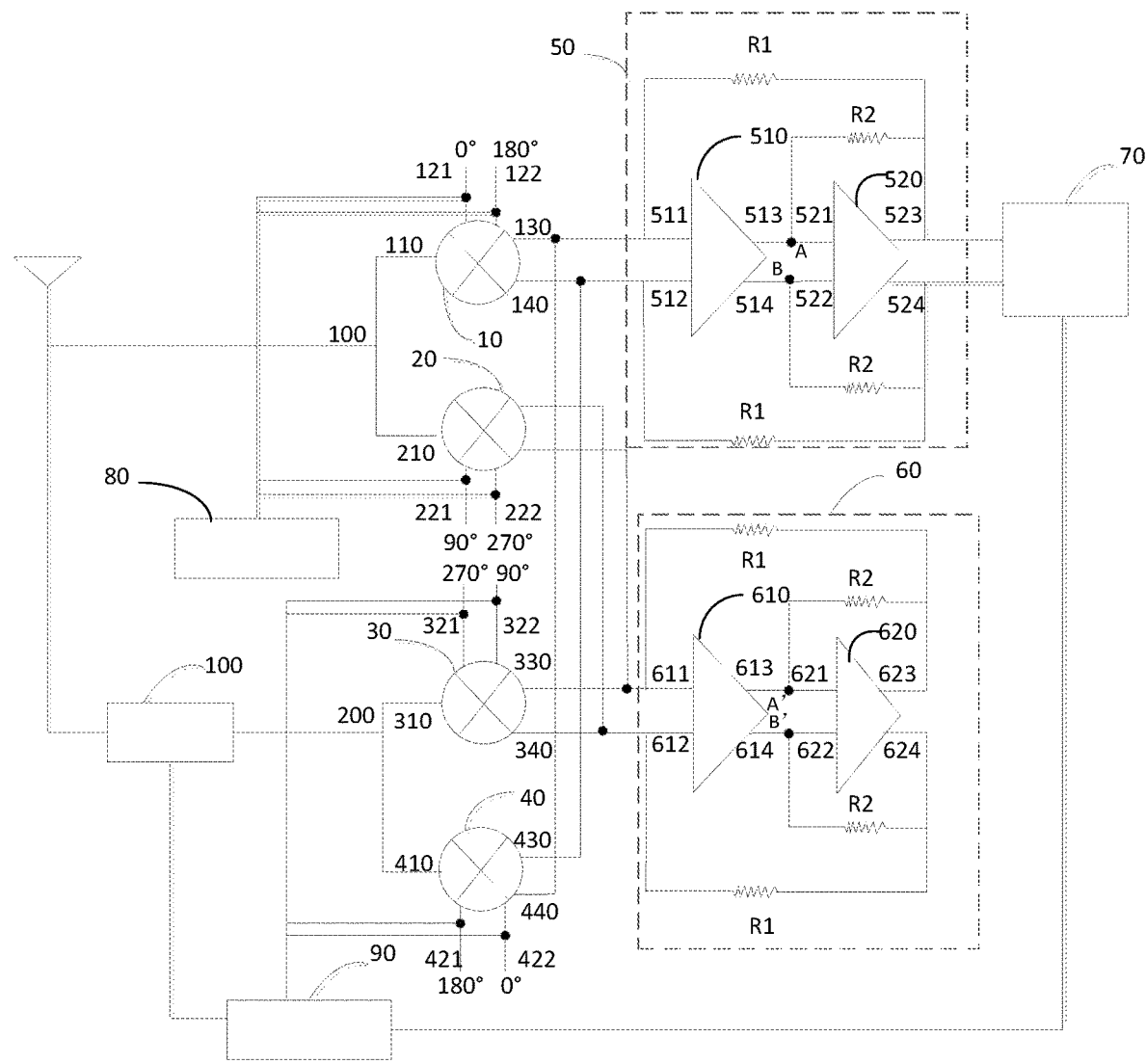
FIG. 5 is a schematic structural diagram of a signal mixing circuit device according to still another embodiment of the disclosure.

In some embodiments, as shown in FIG. 5, the first signal amplifying circuit 50 includes: a first stage of amplifier 510, a second stage of amplifier 520, first resistors R1 and second resistors R2;

where the first stage of amplifier 510 includes a first input terminal 511, a second input terminal 512, a first output terminal 513 and a second output terminal 514, with the first input terminal 511 of the first stage of amplifier 510 connected to the first mixed-signal output terminal 130 of the first mixer 10, and the second input terminal 512 of the first stage of amplifier 510 connected to the second mixed-signal output terminal 140 of the first mixer 10;

the second stage of amplifier 520 includes a first input terminal 521, a second input terminal 522, a first output terminal 523 and a second output terminal 524, with the first input terminal 521 of the second stage of amplifier 520 and the first output terminal 513 of the first stage of amplifier 510 are connected at a first joint A, and the second input terminal 522 of the second stage of amplifier 520 and the second output terminal 514 of the first stage of amplifier 510 connected at a second joint B; and the first resistors R1 are respectively connected in parallel between the first input terminal 511 of the first stage of amplifier 510 and the first output terminal 523 of the second stage of amplifier 520, and between the second input terminal 512 of the first stage of amplifier 510 and the second output terminal 524 of the second stage of amplifier 520; and the second resistors R2 are respectively connected in parallel between the first joint A and the first output terminal 523 of the second stage of amplifier 520, and between the second joint B and the second output terminal 524 of the second stage of amplifier 520.

In some embodiments, as shown in FIG. 5, the second signal amplifying circuit 60 includes a first stage of amplifier 610, a second stage of amplifier 620, first resistors R1 and second resistors R2;

where the first stage of amplifier 610 includes a first input terminal 611, a second input terminal 612, a first output terminal 613 and a second output terminal 614, with the first input terminal 611 of the first stage of amplifier 610 connected to the first mixed-signal output terminal 330 of the third mixer 30, and the second input terminal 612 of the first stage of amplifier 610 connected to the second mixed-signal output terminal 340 of the third mixer;

the second stage of amplifier 620 includes a first input terminal 621, a second input terminal 622, a first output terminal 623 and a second output terminal 624, with the first input terminal 621 of the second stage of amplifier 620 and the first output terminal 613 of the first stage of amplifier 610 connected at a first joint A', and the second input terminal 622 of the second stage of amplifier 620 and the second output terminal 614 of the first stage of amplifier 610 connected at a second joint B'; and the first resistors R1 are respectively connected in parallel between the first input terminal 611 of the first stage of amplifier 610 and the first output terminal 623 of the second stage of amplifier 620, and between the second input terminal 612 of the first stage of amplifier 610 and the second output terminal 624 of the second stage of amplifier 620; and the second resistors R2 are respectively connected in parallel between the first joint A' and the first output terminal 623 of the second stage of amplifier 620, and between the second joint B' and the second output terminal 624 of the second stage of amplifier 620.

In one example, the first stage of amplifier 510, 610 and/or the second stage of amplifier 520, 620 may include a single-stage complementary metal oxide semiconductor circuit unit. The first stage of amplifier 510, 610 and/or the second stage of amplifier 520, 620 may further include a multi-stage complementary metal oxide semiconductor circuit unit.

Herein, the circuit structure formed by the first stage of amplifier 510, 610, the second stage of amplifier 520, 620, the first resistors R1 and the second resistors R2 may be referred to as a nested transimpedance amplifying circuit structure. The transconductance gm1 of the first stage of amplifier 510, 610 may be calculated, and then the open-loop gain A of the nested transimpedance amplifier may be calculated from the transconductance gm1 as $A=gm1*R_2$, where $R_2$ represents the resistance of the second resistor R2. The noise figure can be effectively decreased by increasing the transconductance gm1 of the first stage of amplifier 510, 610.

Given the resistance $R_1$ of the first resistor R1, the input impedance Zin of the nested transimpedance amplifier may be calculated as $Zin=R_1/(gm1*R_2)$. In order to ensure to achieve relatively accurate source impedance matching and reduce the return loss, the input impedance should take a fixed value. Therefore, $R_2$ shall be decreased when gm1 is increased.

Because the ratio $R_1/R_2$ is a fixed value and the input return loss or the input reflection coefficient S11 is in proportion to the ratio $R_1/R_2$, changes in the on-chip resistances $R_1$ and $R_2$ will not affect source impedance matching. If the S11 is decreased, the input impedance matching becomes better, and the transmission loss is reduced. Further, if the gain of the second stage of amplifier 520, 620 is increased, the linearity of the signal mixing circuit device is improved, which not only can meet the source impedance matching, effectively reduce the noise figure, improve the gain and the linearity, but also can reduce the circuit area and decrease the power consumption.

Figure 6:
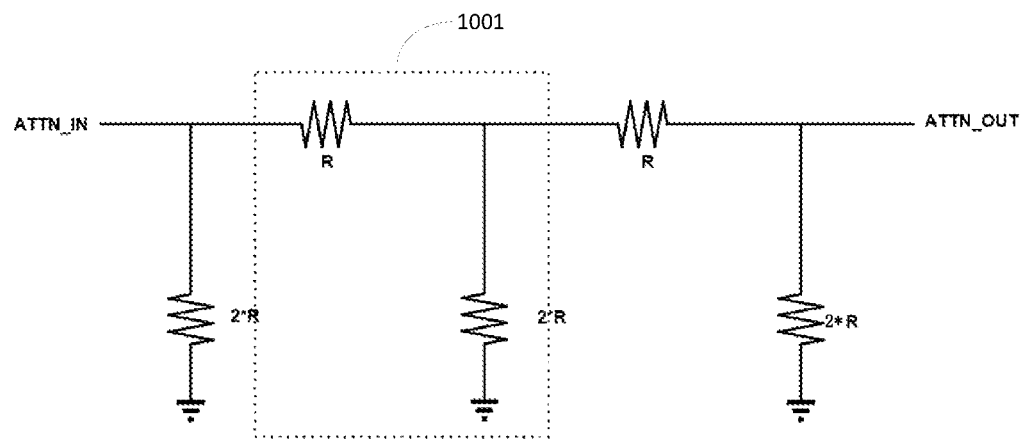
FIG. 6 is a schematic structural diagram of an attenuator according to an embodiment of the disclosure.

In some embodiments, as shown in FIG. 6, an attenuator 100 includes a plurality of first resistors having the same resistance of R and a plurality of second resistors having the same resistance of 2R;

where the plurality of first resistors are connected in series, with one end of each second resistor connected between two adjacent first resistors, and the other end of each second resistor grounded.

In one example, an RF signal having a relatively high signal strength enter the attenuator from the antenna for strength attenuation. The attenuator may be an R-2R attenuator. In the attenuator, the attenuate unit 1001 includes a second resistor and a first resistor. The larger the number of the attenuate units is, the better the attenuation capacity will be, and the number of the attenuate units may be set according to the actual situation, which all falls into the protection scope of the disclosure.

Figure 7:
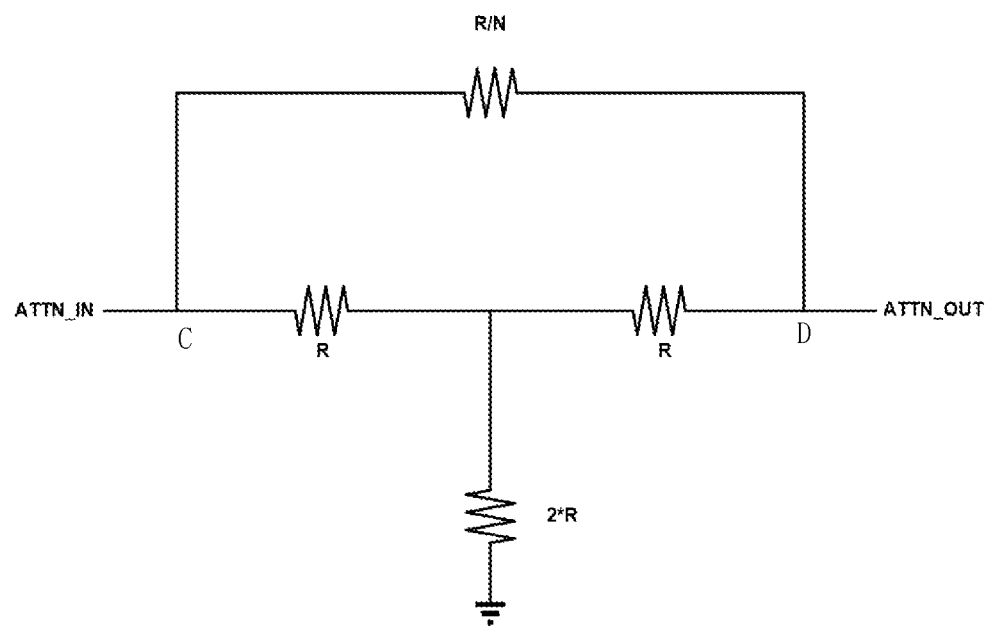
FIG. 7 is a schematic structural diagram of an attenuator according to another embodiment of the disclosure.

In some embodiments, as shown in FIG. 7, the attenuator includes a plurality of first resistors having the same resistance of R, a plurality of second resistors having the same resistance of 2R, and a third resistor having a resistance of R/N, N being greater than or equal to 1;

where the plurality of first resistors are connected in series and form a main circuit, with the third resistor connected in parallel between two ends of the main circuit, one end of each second resistor connected between two adjacent first resistors, and the other end of each second resistor grounded.

In one example, the attenuator 100 may be Bridge-T attenuator. By controlling the Pi and T network of the attenuator 100, different degrees of attenuation may be achieved. The two ends of the third resistor are respectively connected to the third joint C which is connected to the input terminal of the left first resistor and the fourth joint D which is connected to the output terminal of the right first resistor, the third joint C and the fourth joint D respectively functioning as the input terminal and the output terminal of the attenuator 100.

In another specific embodiment, a receiver includes at least one signal mixing circuit device according to the above embodiments. Of course, more signal mixing circuit devices may be provided as practically required, which all falls into the protection scope of the embodiment of the disclosure.

Figure 8:
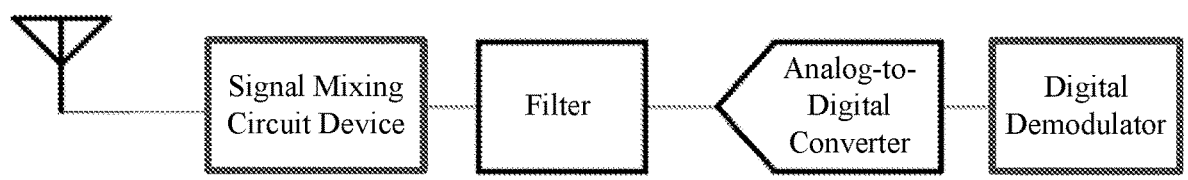
FIG. 8 is a schematic diagram of a receiver according to an embodiment of the disclosure.

As shown in FIG. 8, a filter, an analog-to-digital converter and a digital demodulator are sequentially connected to the signal mixing circuit device, where the filter may be an analog baseband filter, etc. Since a signal mixing circuit device according to the above embodiment is substituted for the band-pass filter or low-pass filter, the Matching Network (MN), the Low Noise Amplifier (LNA) and the mixer in the original receiver, the volume of the receiver can be effectively reduced, the power consumption can be decreased, and the signal amplification efficiency may be improved.

The above description illustrates merely some specific implementation of the present disclosure, but is not intended to limit the scope of protection of the present disclosure, and any variation or replacement readily occurring to those skilled in the art within the technical scope disclosed by the present disclosure should be covered by the protection scope of the present disclosure. Therefore, the protection scope of the present disclosure should be subject to the protection scope of the claims.

What is claimed is:

1. A signal mixing circuit device, comprising a first mixer, a second mixer, a third mixer, a fourth mixer, a first signal amplifying circuit, a second signal amplifying circuit, a signal strength detector, a first controller, a second controller and an attenuator, wherein the signal mixing circuit device is configured such that:

the first mixer, the second mixer and the attenuator are configured to receive a Radio Frequency (RF) signal; and the third mixer and the fourth mixer are configured to receive an output from the attenuator;

the first signal amplifying circuit is configure to receive combined outputs from the first mixer and the fourth mixer, and the second signal amplifying circuit is configured to receive combined outputs from the second mixer and the third mixer; the signal strength detector is configured to receive an output from the first signal amplifying circuit, and the first controller and the second controller are configured to receive an output from the signal strength detector; wherein the first controller is configured to control the first mixer and the second mixer, and the second controller is configured to control the third mixer, the fourth mixer and the attenuator;

the signal strength detector is configured to detect a signal strength value for the output from the first signal amplifying circuit and send a detection result to both the first controller and the second controller;

if the detection result is that the signal strength value is less than a first threshold, the first controller controls the first mixer and the second mixer to be turned on, and the second controller controls the third mixer and the fourth mixer to be turned on and controls the attenuator to be turned off, so that the first mixer samples a first group of local oscillator signals, the fourth mixer phase-invertedly samples the first group of local oscillator signals, the second mixer samples a second group of local oscillator signals, and the third mixer phase-invertedly samples the second group of local oscillator signals.

2. The circuit device of claim 1, wherein the first mixer and the second mixer have respective input terminals connected to each other to receive the RF signal, and the third mixer and the forth mixer have respective input terminals both connected to an output terminal of the attenuator, an input terminal of the attenuator being configured to receive the RF signal; both output terminals of the first mixer and the output terminals of the fourth mixer are connected to input terminals of the first signal amplifying circuit, and both output terminals of the second mixer and output terminals of the third mixer are connected to input terminals of the second signal amplifying circuit; output terminals of the first signal amplifying circuit are connected to input terminals of the signal strength detector, an output terminal of the signal strength detector being connected to both the first controller and the second controller; an output terminal of the first controller is connected to both the first mixer and the second mixer, and output terminals of the second controller are connected to the third mixer, the fourth mixer and the attenuator.

3. The circuit device of claim 1, wherein if the detection result is that the signal strength value is greater than a second threshold, the first controller controls the first mixer and the second mixer to be turned off, and the second controller controls the third mixer, the fourth mixer and the attenuator to be turned on, the first threshold being less than or equal to the second threshold.

4. The circuit device of claim 1, wherein the first controller has an output terminal, which is connected to a first local oscillator signal input terminal of the first mixer, a second local oscillator signal input terminal of the first mixer, a first local oscillator signal input terminal of the second mixer, and a second local oscillator signal input terminal of the second mixer via respective resistors; and the second controller has an output terminal, which is connected to a first local oscillator signal input terminal of the third mixer, a second local oscillator signal input terminal of the third mixer, a first local oscillator signal input terminal of the fourth mixer, and a second local oscillator signal input terminal of the fourth mixer via respective resistors.

5. The circuit device of claim 4, wherein the first group of local oscillator signals comprise a first local oscillator signal and a second local oscillator signal, and the second group of local oscillator signals comprise a third local oscillator signal and a fourth local oscillator signal, wherein:

the first local oscillator signal input terminal of the first mixer is configured to sample the first local oscillator signal, and the second local oscillator signal input terminal of the first mixer is configured to sample the second local oscillator signal;

the first local oscillator signal input terminal of the second mixer is configured to sample the third local oscillator signal, and the second local oscillator signal input terminal of the second mixer is configured to sample the fourth local oscillator signal;

the first local oscillator signal input terminal of the third mixer is configured to sample the fourth local oscillator signal, and the second local oscillator signal input terminal of the third mixer is configured to sample the third local oscillator signal; and the first local oscillator signal input terminal of the fourth mixer is configured to sample the second local oscillator signal, and second local oscillator signal input terminal of the fourth mixer is configured to sample the first local oscillator signal.

6. The circuit device of claim 5, wherein the first local oscillator signal, the second local oscillator signal, the third local oscillator signal, and the fourth local oscillator signal have phases of 0°, 180°, 90° and 270°, respectively, so that phase differences between the first local oscillator signal and the second local oscillator signal and between the third local oscillator signal and the fourth local oscillator signal are each 180°.

7. The circuit device of claim 4, wherein each of the first mixer, the second mixer, the third mixer and the fourth mixer has a first mixed-signal output terminal and a second mixed-signal output terminal, wherein:

the first mixed-signal output terminal of the first mixer and the second mixed-signal output terminal of the fourth mixer are connected to each other, and the second mixed-signal output terminal of the first mixer and the first mixed-signal output terminal of the fourth mixer are connected to each other; and the first mixed-signal output terminal of the second mixer and the second mixed-signal output terminal of the third mixer are connected to each other, and the second mixed-signal output terminal of the second mixer and the first mixed-signal output terminal of the third mixer are connected to each other.

8. The circuit device of claim 7, wherein the first mixer comprises a first transistor switch and a second transistor switch, wherein:

the first transistor switch comprises: a gate configured to sample the first local oscillator signal to function as the first local oscillator signal input terminal of the first mixer; a drain functioning as the first mixed-signal output terminal of the first mixer; and a source;

the second transistor switch comprises: a gate configured to sample the second local oscillator signal to function as the second local oscillator signal input terminal of the first mixer; a drain functioning as the second mixed-signal output terminal of the first mixer; and a source; and the source of the first transistor switch and the source of the second transistor switch are connected to each other to function as an input terminal of the first mixer for receiving the RF signal.

9. The circuit device of claim 7, wherein the second mixer comprises a first transistor switch and a second transistor switch, wherein:

the first transistor switch comprises: a gate configured to sample the third local oscillator signal to function as the first local oscillator signal input terminal of the second mixer; a drain functioning as the first mixed-signal output terminal of the second mixer; and a source;

the second transistor switch comprises: a gate configured to sample the fourth local oscillator signal to function as the second local oscillator signal input terminal of the second mixer; a drain functioning as the second mixed-signal output terminal of the second mixer; and a source; and the source of the first transistor switch and the source of the second transistor switch are connected to each other to function as an input terminal of the second mixer for receiving the RF signal.

10. The circuit device of claim 7, wherein the third mixer comprises a first transistor switch and a second transistor switch, wherein:

the first transistor switch comprises: a gate configured to sample the fourth local oscillator signal to function as the first local oscillator signal input terminal of the third mixer; a drain functioning as the first mixed-signal output terminal of the third mixer; and a source;

the second transistor switch comprises: a gate configured to sample the third local oscillator signal to function as the second local oscillator signal input terminal of the third mixer; a drain functioning as the second mixed-signal output terminal of the third mixer; and a source; and the source of the first transistor switch and the source of the second transistor switch are connected to each other to function as an input terminal of the third mixer for receiving the output from the attenuator.

11. The circuit device of claim 7, wherein the fourth mixer comprises a first transistor switch and a second transistor switch, wherein:

the first transistor switch comprises: a gate configured to sample the second local oscillator signal to function as the first local oscillator signal input terminal of the fourth mixer; a drain functioning as the first mixed-signal output terminal of the fourth mixer; and a source;

the second transistor switch comprises: a gate configured to sample the first local oscillator signal to function as the second local oscillator signal input terminal of the fourth mixer; a drain functioning as the second mixed-signal output terminal; and a source; and the source of the first transistor switch and the source of the second transistor switch are connected to each other to function as an input terminal of the fourth mixer for receiving the output from the attenuator.

12. The circuit device of claim 7, wherein the first signal amplifying circuit comprises a first stage of amplifier and first resistors, wherein:

the first stage of amplifier comprises a first input terminal, a second input terminal, a first output terminal and a second output terminal, with the first resistors respectively connected in parallel between the first input terminal and the first output terminal, and between the second input terminal and the second output terminal; and the first input terminal of the first stage of amplifier is connected to the first mixed-signal output terminal of the first mixer, and the second input terminal of the first stage of amplifier is connected to the second mixed-signal output terminal of the first mixer.

13. The circuit device of claim 7, wherein the second signal amplifying circuit comprises a first stage of amplifier and first resistors, wherein:

the first stage of amplifier comprises a first input terminal, a second input terminal, a first output terminal and a second output terminal, with the first resistors respectively connected in parallel between the first input terminal and the first output terminal, and between the second input terminal and the second output terminal; and the first input terminal of the first stage of amplifier is connected to the first mixed-signal output terminal of the third mixer, and the second input terminal of the first stage of amplifier is connected to the second mixed-signal output terminal of the third mixer.

14. The circuit device of claim 7, wherein the first signal amplifying circuit comprises a first stage of amplifier, a second stage of amplifier, first resistors and second resistors, wherein:
   the first stage of amplifier comprises a first input terminal, a second input terminal, a first output terminal and a second output terminal, with the first input terminal of the first stage of amplifier connected to the first mixed-signal output terminal of the first mixer, and the second input terminal of the first stage of amplifier connected to the second mixed-signal output terminal of the first mixer;
   the second stage of amplifier comprises a first input terminal, a second input terminal, a first output terminal and a second output terminal, with the first input terminal of the second stage of amplifier and the first output terminal of the first stage of amplifier connected at a first joint, and the second input terminal of the second stage of amplifier and the second output terminal of the first stage of amplifier connected at a second joint; and
   the first resistors are respectively connected in parallel between the first input terminal of the first stage of amplifier and the first output terminal of the second stage of amplifier, and between the second input terminal of the first stage of amplifier and the second output terminal of the second stage of amplifier; and the second resistors are respectively connected in parallel between the first joint and the first output terminal of the second stage of amplifier, and between the second joint and the second output terminal of the second stage of amplifier.

15. The circuit device of claim 7, wherein the second signal amplifying circuit comprises a first stage of amplifier, a second stage of amplifier, first resistors and second resistors, wherein:
   the first stage of amplifier comprises a first input terminal, a second input terminal, a first output terminal and a second output terminal, with the first input terminal of the first stage of amplifier connected to the first mixed-signal output terminal of the third mixer, and the second input terminal of the first stage of amplifier connected to the second mixed-signal output terminal of the third mixer;
   the second stage of amplifier comprises a first input terminal, a second input terminal, a first output terminal and a second output terminal, with the first input terminal of the second stage of amplifier and the first output terminal of the first stage of amplifier connected at a first joint, and the second input terminal of the second stage of amplifier and the second output terminal of the first stage of amplifier connected at a second joint; and
   the first resistors are respectively connected in parallel between the first input terminal of the first stage of amplifier and the first output terminal of the second stage of amplifier, and between the second input terminal of the first stage of amplifier and the second output terminal of the second stage of amplifier; and the second resistors are respectively connected in parallel between the first joint and the first output terminal of the second stage of amplifier, and between the second joint and the second output terminal of the second stage of amplifier.

16. The circuit device of claim 1, wherein the attenuator comprises a plurality of first resistors having the same resistance of R and a plurality of second resistors having the same resistance of 2R,
   wherein the plurality of first resistors are connected in series, with one end of each second resistor connected between two adjacent first resistors, and the other end of each second resistor grounded.

17. The circuit device of claim 1, wherein the attenuator comprises a plurality of first resistors having the same resistance of R, a plurality of second resistors having the same resistance of 2R, and a third resistor having a resistance of R/N, N being greater than or equal to 1;
   wherein the plurality of first resistors are connected in series to form a main circuit, with the third resistor connected in parallel between two ends of the main circuit, one end of each second resistor connected between two adjacent first resistors, and the other end of each second resistor grounded.

18. A receiver comprising at least one signal mixing circuit device of claim 1.

* * * * *